United States Patent [19]
Celaya et al.

[11] Patent Number: 5,808,873
[45] Date of Patent: Sep. 15, 1998

[54] ELECTRONIC COMPONENT ASSEMBLY HAVING AN ENCAPSULATION MATERIAL AND METHOD OF FORMING THE SAME

[75] Inventors: Phillip C. Celaya, Phoenix; John R. Kerr, Peoria, both of Ariz.

[73] Assignee: Motorola, Inc., Schaumburg, Ill.

[21] Appl. No.: 865,652

[22] Filed: May 30, 1997

[51] Int. Cl.$^6$ .................................................... H05K 1/18
[52] U.S. Cl. .................... 361/760; 361/764; 361/762; 361/783; 361/710; 361/765; 361/772; 361/767; 257/787; 257/784; 257/723; 257/783; 257/676; 257/700; 257/735; 257/736; 439/66; 439/91
[58] Field of Search .................... 361/760, 764, 361/762, 783, 710, 765, 772, 767, 820; 257/787, 784, 723, 724, 783, 676, 700, 735, 736, 738, 782, 788, 774, 773; 439/66, 91

[56] References Cited

U.S. PATENT DOCUMENTS

| | | | |
|---|---|---|---|
| 5,239,198 | 8/1993 | Lin et al. | 257/693 |
| 5,455,456 | 10/1995 | Newman | 257/704 |
| 5,468,784 | 11/1995 | Yanagawa et al. | 522/31 |
| 5,468,999 | 11/1995 | Lin et al. | 257/784 |
| 5,652,463 | 7/1997 | Weber et al. | 257/706 |

*Primary Examiner*—Michael W. Phillips
*Assistant Examiner*—David Foster
*Attorney, Agent, or Firm*—Kenneth M. Seddon; Daniel R. Collopy

[57] ABSTRACT

An electronic component assembly (10) is formed by mounting an electronic component (31) to a substrate (11). An encapsulating material (33) is used to protect the electronic component (31) from environmental hazards. The encapsulating material (33) is formed by dispensing an encapsulating fluid over the electronic component (31). A trench (36) is formed in a masking layer (21) on a substrate (11) to stop the flow of the encapsulating fluid. The trench (36) provides an edge (35) which acts as a discontinuity in the surface (23) of the masking layer (21). This discontinuity is sufficient to control the flow of the encapsulating fluid until the encapsulating fluid is cured to form the encapsulating material (33).

14 Claims, 1 Drawing Sheet

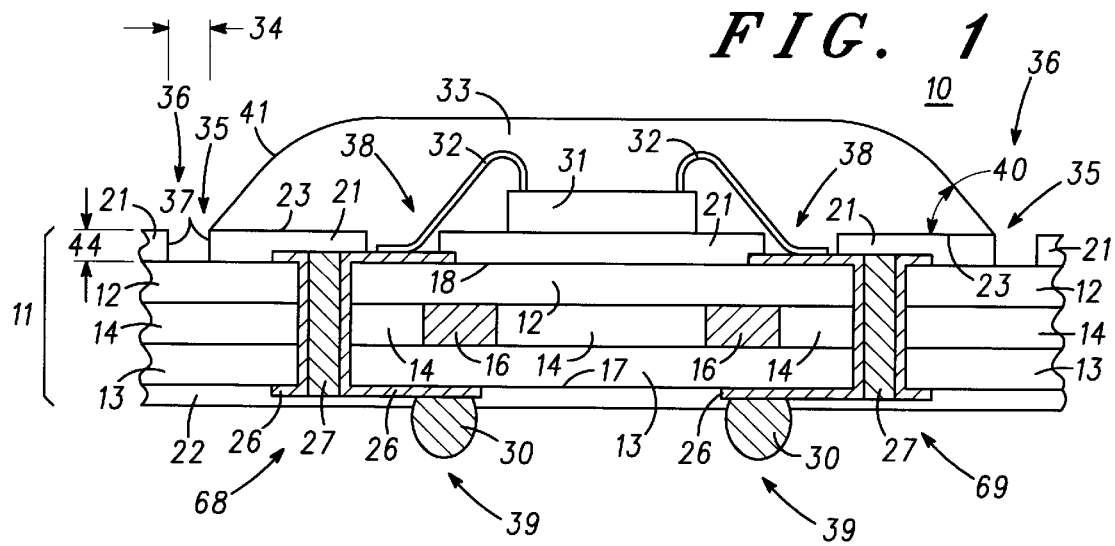
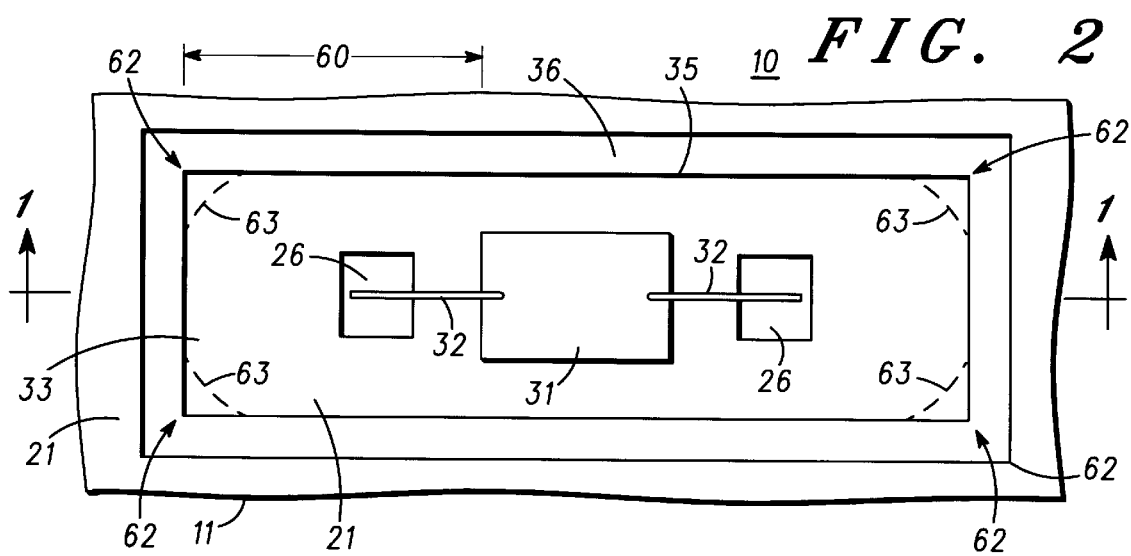
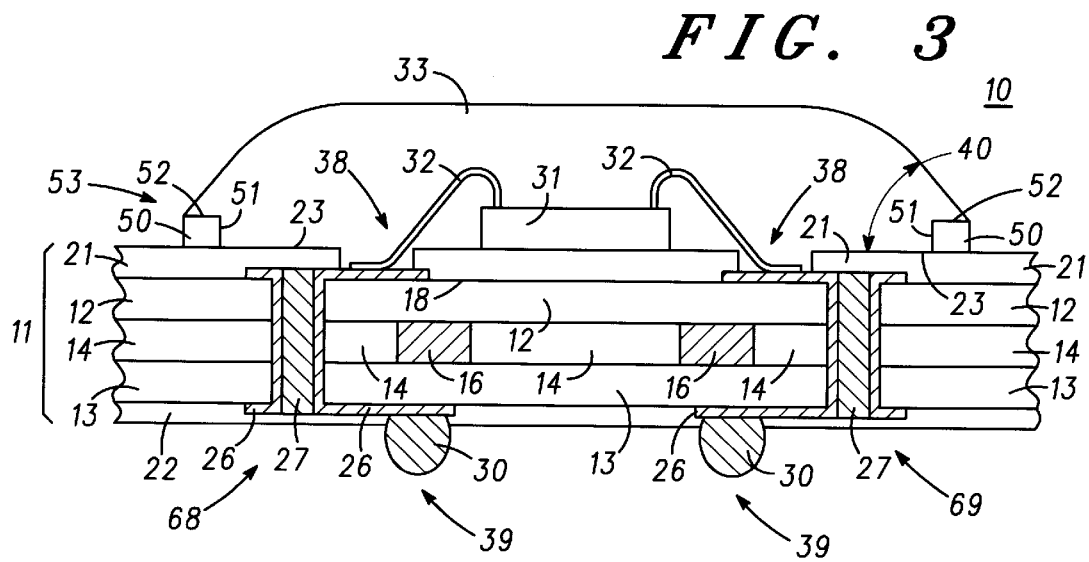

ELECTRONIC COMPONENT ASSEMBLY HAVING AN ENCAPSULATION MATERIAL AND METHOD OF FORMING THE SAME

BACKGROUND OF THE INVENTION

The present invention is related to a co-pending application (attorney's docket number SC09721T) that was filed on Jul. 31, 1996, and has serial number 08/688,935. The inventor of the co-pending application is John Baird, and the application is assigned to the same assignee as the present invention.

This invention relates, in general, to electronic components, and more particularly to methods of encapsulating an electronic component into a package.

Glob top (GT) packages have been developed as an alternative to placing semiconductor devices into a molded plastic package. Glob top packages are formed by first bonding a semiconductor device onto a substrate and then forming a dam around the semiconductor device using a bead of a very viscous fluid. The semiconductor device is then covered with an encapsulation fluid that readily flows over the semiconductor device and fills the region defined by the dam.

The dam is necessary to confine the encapsulation fluid so that a portion of the fluid remains over the semiconductor device. The encapsulation material fills the area defined by the dam until it reaches a hydrostatic equilibrium state so that the depth of the encapsulation fluid is approximately 0.3 millimeters above the semiconductor device. Once the semiconductor device is covered, the substrate is cured so that both the viscous fluid and the encapsulation fluid are hardened to properly protect the semiconductor device.

One drawback of the glob top process described above is that it requires the use of the viscous fluid used to form the dam. Not only is there added expense with the viscous fluid, but accurate control is required as the viscous fluid is dispensed to ensure that the dam has the proper height and width. If the viscous fluid does not have the proper viscosity or dimensions to retain the encapsulation fluid, then the semiconductor device will not be properly protected.

In a previously known technique for forming Glob Top packages, routing slots are formed that pass completely through the substrate to provide a wetting termination line. The wetting termination line is then used to control the flow of an encapsulation fluid. However, this process may have limitations when used on printed circuit boards because of the many layers of electrical interconnect that are common to printed circuit boards. The formation of routing slots that pass completely through the substrate may complicate the layout configuration of the electrical interconnect lines so that they are not interrupted by one of the routing slots.

By now it should be appreciated that it would be advantageous to provide a method of encapsulating a semiconductor device without the necessity of forming a dam structure around the semiconductor device. Such a process would eliminate the cost of the dam material and remove the complexity of forming the dam with the required viscosity and dimensions necessary to properly contain the encapsulation fluid.

BRIEF DESCRIPTION OF THE DRAWINGS

FIG. 1 is an enlarged cross-sectional view of an electronic component assembly formed in accordance with the present invention;

FIG. 2 is an enlarged top view of the electronic component assembly in accordance with the present invention; and FIG. 3 is an enlarged cross-sectional view of the electronic component assembly formed in accordance with an alternate embodiment of the present invention.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION OF THE DRAWINGS

In general, the present invention provides a novel process for encapsulating electronic components on a printed circuit board by flowing an encapsulation fluid over the electronic component. The printed circuit board has a solder masking layer that has a trench pattern. The distance that the encapsulation fluid flows is determined by a wetting termination edge or line that is provided by the inner edge of the trench in the solder mask layer. The edge of the trench prevents the encapsulation fluid from flowing into or beyond the trench and retains the encapsulation fluid within a desired area. The wetting termination edge substantially replaces the functionality provided by prior dam structures.

Turning now to FIG. 1, a more detailed description of the present invention is provided. FIG. 1 is an enlarged cross-sectional view of an electronic component assembly 10 that comprises an electronic component 31 that is formed on a substrate 11. In the preferred embodiment, substrate 11 is a printed circuit board and a bracket is used in FIG. 1 to illustrate that substrate 11 can comprise a plurality of layers. For example, substrate 11 can include an interconnect layer 14 sandwiched between two dielectric layers 12 and 13. Interconnect layer 14 can contain metal traces 16 that are used to provide electrical connection between neighboring electronic components (not shown). Dielectric layers 12 and 13 can be made from a variety of materials including: polyimide, epoxy glass, and bimaleimide-trazine (BT) resin.

It should be understood that the present invention is not limited to applications solely involving a printed circuit board. The present invention may have benefits in other applications as substrate 11 could be a leadframe, a semiconductor substrate, a ceramic substrate, or similar material. Additionally, electronic component 31 can be bonded or mounted to substrate 11 using a variety of techniques known in the art and can be a semiconductor device, an integrated circuit, or an optical component.

Dielectric layer 12 and 13 have surfaces 17 and 18, respectively, upon which electronic components or electrical interconnect structures are formed. Vias 68 and 69 are used provide electrical connection between surfaces 17 and 18 of substrate 11. Each via 68 and 69 includes an opening that passes through dielectric layer 12, interconnect layer 14, and dielectric layer 13. Vias 68 and 69 also include plated through holes 26 and conductive material 27 to provide electrical connection through substrate 11. As shown in FIG. 1 a portion of plated through holes 26 may be extended across surfaces 17 and 18 to provide bonding pads 38 and 39. Hatched markings are used to indicate the region where plated through holes 26 exist along the surface 18 of dielectric layer 12, along the sides of vias 68 and 69 that expose portions of interconnect layer 14 and dielectric layers 12 and 13, and along the surface 17 of dielectric layer 13. Arrows are used in FIG. 1 to indicate the portion of plated through hole 26 that are referred to as bonding pads 38 and 39. Bonding pads 38 and 39 are portions of plated through holes 26. The arrows are not intended to refer to solder balls 30 that are formed on bonding pads 39 or to the wires 32 that are connected to bonding pads 38. Bonding pads 38 can be used for the placement of a bonding wire 32 that runs between each bonding pad 38 and electronic component 31. Bonding pads 39 can be used to the placement of a solder ball 30, which is electrically connected to electronic component 31. It is also possible to form other structure onto bonding pads 39 to provide electrical coupling or physical mounting to substrate 11.

Substrate 11 also includes a masking layer 21 over the surface 18 of dielectric layer 12 and a masking layer 22 over the surface 17 of dielectric layer 13. Masking layers 21 and 22 have openings that are used to define the portions of substrate 11 that are exposed to plating processes that are used to form bonding pads 38 and 39. These openings are also used to allow bonding wires 32 or solder balls 30 to physically contact structures that are under masking layers 21 and 22. Masking layer 21 is also referred to as a solder masking layer as it can be used to determine the placement of solder during the formation of electronic component assembly 10.

In the present invention, a trench 36 is formed in masking layer 21 to provide a discontinuity at a surface 23 of masking layer 21. Trench 36 has sidewalls 37 that extend from the surface 23 to provide an edge 35. Preferably, sidewalls 37 are substantially perpendicular to the surface 23 of masking layer 21 to provide a sharp profile at the surface 23 of masking layer 21. However, sidewalls 37 can be at other angles to the surface 23 as long as the profile of edge 35 of trench 36 is sufficient to halt the flow of the fluid used to form encapsulating material 33 as discussed below.

Encapsulating material 33 encases electronic component 31 and bonding wires 32 to protect these structures from the harsh environments that electronic component assembly 10 may be placed in. Encapsulating material 33 is formed by dispensing an encapsulating fluid over electronic component 31. FIG. 1 illustrates the final shape of the encapsulating fluid after is has been cured to provide encapsulating material 33. A variety of fluids can be used to form encapsulation material 33 such as SUMIRESN EXCEL (CRP-X4095) manufactured by Sumitomo Bakelight of Tokyo, Japan.

As the encapsulation fluid is dispensed onto electronic component 31, it flows across the surface 23 of masking layer 21. The encapsulating fluid has an edge 41 that has a slope that provides a wetting angle 40 relative to surface 23. The magnitude of wetting angle 40 depends on the surface tension properties of the encapsulating fluid and the cleanliness and wetting characteristics of surface 23 of masking layer 21. As shown in FIG. 1, the slope of wetting angle 40 is such that the encapsulation fluid cannot flow over the edge 35 of trench 36. Thus, the encapsulation fluid is constrained to a region defined by trench 36 around and adjacent to electronic component 31.

As indicated in FIG. 1, trench 36 has a width 34, which is preferably at least 0.5 microns, and a depth 44 that is equal to the thickness of masking layer 21. However, these dimensions should not be considered critical. It is possible that the width 34 of trench 36 be wider or narrower as long as the edge 35 of trench 36 is sufficient to provide a discontinuity in the surface 23 of masking layer 21 to terminate the flow of the fluid used to form encapsulating material 33. The same is true for the depth 44 of trench 36. As shown in FIG. 1, trench 36 passes completely through masking layer 21 and exposes a portion of dielectric layer 12. However, it is also possible to form trench 36 so that it does not completely pass through masking layer 21 as long as the depth is sufficient to provide edge 35.

FIG. 2 is an enlarged top view of electronic component assembly 10 and is used to illustrate how trench 36 is used to define the location of encapsulating material 33. As shown in FIG. 2, trench 36 in masking layer 21 completely encompasses electronic component 31. Therefore, the edge 35 of trench 36 provides a continuous boundary for the encapsulation fluid as it is dispensed over electronic component 31. However, it should be understood that trench 36 need not be continuous in order to provide an effective boundary for the flow of encapsulating fluid. A large portion of the edge 41 (see FIG. 1) of the encapsulating fluid used to form encapsulating material 33 is coincident with the edge 35 of trench 36. However, due to the surface tension of the encapsulating fluid, encapsulating material 33 does not extend completely into the corners 62 provided by trench 36.

A dashed line 63, is used to represent the extent to which the encapsulating fluid can flow towards the edge of trench 36 near corners 62. Therefore, the edge 35 of trench 36 and the dash line 63 represent the wetting termination line for the flow of the encapsulating fluid. It should be appreciated that the configuration of trench 36 can be changed so that it is rounded in corners 62 so that the entire edge 41 of encapsulating material 33 is in contact with the edge 35 of trench 36. It is also possible to form trench 36 so that it is discontinuous in places, but due to the surface tension of the encapsulating fluid, the placement of encapsulation material 33 can be controlled. Additionally, the position of trench 36 relative to electronic component 31 can be adjusted as desired to control the size of encapsulating material 33. As indicated in FIG. 2 with bracket 60, the distance between electronic component 31 and trench 36 is preferably at least about 100 microns.

Referring now to FIG. 3, an alternate embodiment of the present invention is provided. FIG. 3 is an enlarged cross-sectional view of electronic component assembly 10 that is formed with the use of a frame pattern 50 instead of a trench as discussed earlier. Frame pattern 50 is a structure formed on the surface 23 of masking layer 21 that provides an edge 53 that is used to terminate the flow of encapsulating fluid. Due to the surface tension properties of the encapsulating fluid, the encapsulating fluid flows up the sidewalls 51 and across the upper surface 52 of the frame pattern 50. However, the flow of the encapsulating fluid terminates at the edge 53 of the frame pattern 50 because the wetting angle 40 of the encapsulating fluid is not sufficient to flow beyond frame pattern 50. Frame pattern 50 can be formed on the surface 23 of masking layer 21 using a variety of techniques such as stamping a pattern of wax or adhesive.

The present invention differs from previously known encapsulation techniques in that a trench is formed in the upper layer of a printed circuit board to control the wettability of the printed circuit board. This in turn stops the flow of an encapsulation fluid because the wetting angle of the encapsulating fluid is too small to flow across the trench. In contrast, previously known techniques formed a dam structure that relies on hydrostatic equilibrium to contain an encapsulation fluid and did not use the wettability of the surface to control the flow or spreading of an encapsulation fluid.

One of the advantages of the present invention is that the need to form a dam structure to control the flow of an encapsulating fluid has been obviated. It should be noted that trench structure 36 can be formed simultaneously with the formation of the other openings in masking layer 21. These other openings are typically needed to define the areas on substrate 11 that are to be exposed to plating steps, soldering steps, or other processing steps needed for the formation of printed circuit boards. Another advantage of the present invention is that is does not require the formation of holes or slots that pass completely through substrate 11. Thus, the use of trenches in a masking layer is well suited for applications involving printed circuit boards because there is no need to disrupt or re-rout the interconnect lines that are commonly used in printed circuit boards.

Therefore, the present invention does not require any additional process steps and eliminates the process steps associated with the formation of a dam structure. Consequently the manufacturing process of electronic component assemblies in accordance with the present invention are not only cheaper, but can be done without the complexity and reliability issues associated with formation of a dam structure.

We claim:

1. An electronic component assembly comprising:
    a substrate;
    a masking layer overlying the substrate and having a surface, wherein there is a discontinuity at the surface of the masking layer to provide a wetting termination edge;
    an electronic component overlying the surface of the substrate; and
    an encapsulation material having an edge, wherein the encapsulation material overlies the electronic component and the edge of the encapsulation material is coincident with the wetting termination edge.

2. The electronic component assembly of claim 1 wherein the substrate is a printed circuit board.

3. The electronic component assembly of claim 1 further comprising a trench in the masking layer that extends from the surface, and the discontinuity at the surface of the masking layer is provided by the trench.

4. The electronic component assembly of claim 3 wherein the trench has a width of at least about 0.5 microns.

5. The electronic component assembly of claim 3 wherein the trench extends completely through the masking layer, thereby exposing a portion of the substrate.

6. The electronic component assembly of claim 1 wherein the masking layer is a solder masking layer that exposes portions of the substrate.

7. The electronic component assembly of claim 1 further comprising a frame pattern that is overlying the surface of the masking layer and has an upper surface and an edge, wherein the discontinuity at the surface is provided by the frame pattern, and the edge of the encapsulation material is overlying the upper surface of the frame pattern and is coincident with the edge of the frame pattern.

8. An electronic component assembly comprising:
    a printed circuit board;
    a masking layer overlying the printed circuit board, wherein the masking layer has a surface and a trench, the trench providing an edge at the surface of the masking layer;
    an electronic component overlying the printed circuit board, wherein at least a portion of the electronic component is encircled by the trench in the masking layer; and
    an encapsulation material having an edge and overlying the electronic component, wherein at least a portion of the edge of the encapsulation material coincides with the edge provided by the trench in the masking layer.

9. The electronic component assembly of claim 8 wherein the trench passes through the masking layer an exposes a portion of the printed circuit board.

10. The electronic component assembly of claim 8 wherein the printed circuit board includes an interconnect layer between two layers of dielectric material.

11. The electronic component assembly of claim 8 wherein the trench in the masking layer is at least 100 microns from the electronic component.

12. The electronic component assembly of claim 8 further comprising a bonding wire that extends from the electronic component to the printed circuit board, wherein the bonding wire is encased in the encapsulation material.

13. A method of assembling an electronic component comprising the steps of:
    providing a printed circuit board having an upper layer, wherein the upper layer has a surface and a trench that provides an edge;
    mounting the electronic component to the printed circuit board; and
    dispensing an encapsulation material, wherein the encapsulation material has an edge and a portion of the edge of the encapsulation material terminates at the edge provided by the trench.

14. The method of claim 13 wherein the trench in the upper layer is at least 100 microns from the electronic component.

* * * * *